United States Patent
Smith et al.

(10) Patent No.: US 9,929,291 B2
(45) Date of Patent: Mar. 27, 2018

(54) PHOTO-DETECTOR HAVING PLASMONIC RESONANCE AND PHOTON CRYSTAL THERMAL NOISE SUPPRESSION

(71) Applicant: Raytheon Company, Waltham, MA (US)

(72) Inventors: Edward P. Smith, Santa Barbara, CA (US); Anne Itsuno, Santa Barbara, CA (US); Justin Gordon Adams Wehner, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 261 days.

(21) Appl. No.: 14/174,172

(22) Filed: Feb. 6, 2014

(65) Prior Publication Data

US 2015/0221796 A1 Aug. 6, 2015

(51) Int. Cl.
| | |
|---|---|
| H01L 31/0352 | (2006.01) |
| H01L 31/09 | (2006.01) |
| H01L 27/144 | (2006.01) |
| H01L 31/0232 | (2014.01) |
| H01L 31/101 | (2006.01) |
| H01L 31/109 | (2006.01) |
| H01L 27/146 | (2006.01) |

(52) U.S. Cl.
CPC ...... *H01L 31/0352* (2013.01); *H01L 27/1446* (2013.01); *H01L 31/02327* (2013.01); *H01L 31/035281* (2013.01); *H01L 31/09* (2013.01); *H01L 31/101* (2013.01); *H01L 31/109* (2013.01); *H01L 27/14649* (2013.01); *Y02E 10/50* (2013.01)

(58) Field of Classification Search
CPC ............... H01L 27/144; H01L 27/1446; H01L 27/14601; H01L 2933/0083
See application file for complete search history.

(56) References Cited

U.S. PATENT DOCUMENTS

| | | |
|---|---|---|
| 5,068,524 A | 11/1991 | Elliott et al. |
| 5,990,850 A | 11/1999 | Brown et al. |
| 6,441,298 B1 | 8/2002 | Thio |
| 6,713,832 B2 | 3/2004 | Pardo et al. |
| 6,898,362 B2 | 5/2005 | Forbes et al. |
| 6,906,358 B2 | 6/2005 | Grein et al. |
| 8,462,827 B2 | 6/2013 | Matsuo et al. |
| 8,853,526 B2 | 10/2014 | Kostecki et al. |

(Continued)

FOREIGN PATENT DOCUMENTS

| | | |
|---|---|---|
| EP | 1 247 301 B1 | 3/2008 |
| EP | 2 523 220 A1 | 11/2012 |

(Continued)

OTHER PUBLICATIONS

Machine Translation of KR 10-2009-0033085.*

(Continued)

*Primary Examiner* — Daniel Whalen
*Assistant Examiner* — Suberr Chi
(74) *Attorney, Agent, or Firm* — Daly, Crowley, Mofford & Durkee, LLP

(57) ABSTRACT

A photo-detector having a photonic crystal structure for absorbing photons passing perpendicular to a surface of the photo-detector and a plasmonic resonance structure for absorbing photons passing along the surface of the photo-detector.

4 Claims, 8 Drawing Sheets

(56) References Cited

U.S. PATENT DOCUMENTS

| | | |
|---|---|---|
| 8,941,203 B2 | 1/2015 | Wehner et al. |
| 2003/0010979 A1 | 1/2003 | Pardo et al. |
| 2008/0217542 A1 | 9/2008 | Verma et al. |
| 2009/0323060 A1 | 12/2009 | Knipp |
| 2010/0175745 A1 | 7/2010 | Kostecki et al. |
| 2011/0147877 A1* | 6/2011 | Wehner et al. ............... 257/446 |
| 2012/0205541 A1* | 8/2012 | Lee et al. ................... 250/338.4 |
| 2012/0235262 A1 | 9/2012 | Jones et al. |
| 2013/0168536 A1 | 7/2013 | Guo et al. |
| 2013/0228887 A1 | 9/2013 | Wehner et al. |

FOREIGN PATENT DOCUMENTS

| | | |
|---|---|---|
| WO | WO 2006/007446 A2 | 1/2006 |
| WO | WO 2006/007446 A3 | 1/2006 |
| WO | WO 2009/012397 A2 | 1/2009 |
| WO | WO 2010/092362 A2 | 8/2010 |
| WO | WO 2010/092362 A3 | 8/2010 |
| WO | WO 2011/163522 A2 | 12/2011 |
| WO | WO 2011/163522 A3 | 12/2011 |
| WO | WO 2013/067541 A1 | 5/2013 |

OTHER PUBLICATIONS

Notification of Transmittal of the International Search Report and the Written Opinion of the International Searching Authority, or the Declaration, PCT/US2014/066057, dated Mar. 9, 2015, 1 page.

International Search Report, PCT/US2014/066057, dated Mar. 9, 2015, 6 pages.

Written Opinion of the International Searching Authority, PCT/US2014/066057, dated Mar. 9, 2015, 11 pages.

Jessie Rosenberg, Rajeev V. Shenoi, Sanjay Krishna, Oskar Painter, Design of Plasmonic Photonic Crystal Resonant Cavities for Polarization Sensitive Infrared Photodetectors, Optics Express, Feb. 15, 2010, vol. 18., No. 4, 14 pages.

Chao Xiang, Jian Wang, Chun-Kit Chan, Ultra-Compact Plasmonic Microresonator with Efficient Thermo-Optic Tuning, High Quality Factor and Small Mode Volume, CLEO:2013 Technical Digest © OSA 2013, 2 pages.

Notification Concerning Transmittal of the International Preliminary Report on Patentability (Chapter I of the Patent Cooperation Treaty), PCT/US2014/066057, dated Aug. 18, 2016, 1 page.

International Preliminary Report on Patentability, PCT/US2014/066057, dated Aug. 9, 2016, 1 page.

Written Opinion of the International Searching Authority, PCT/US2014/066057, dated Aug. 18, 2016, 10 pages.

* cited by examiner

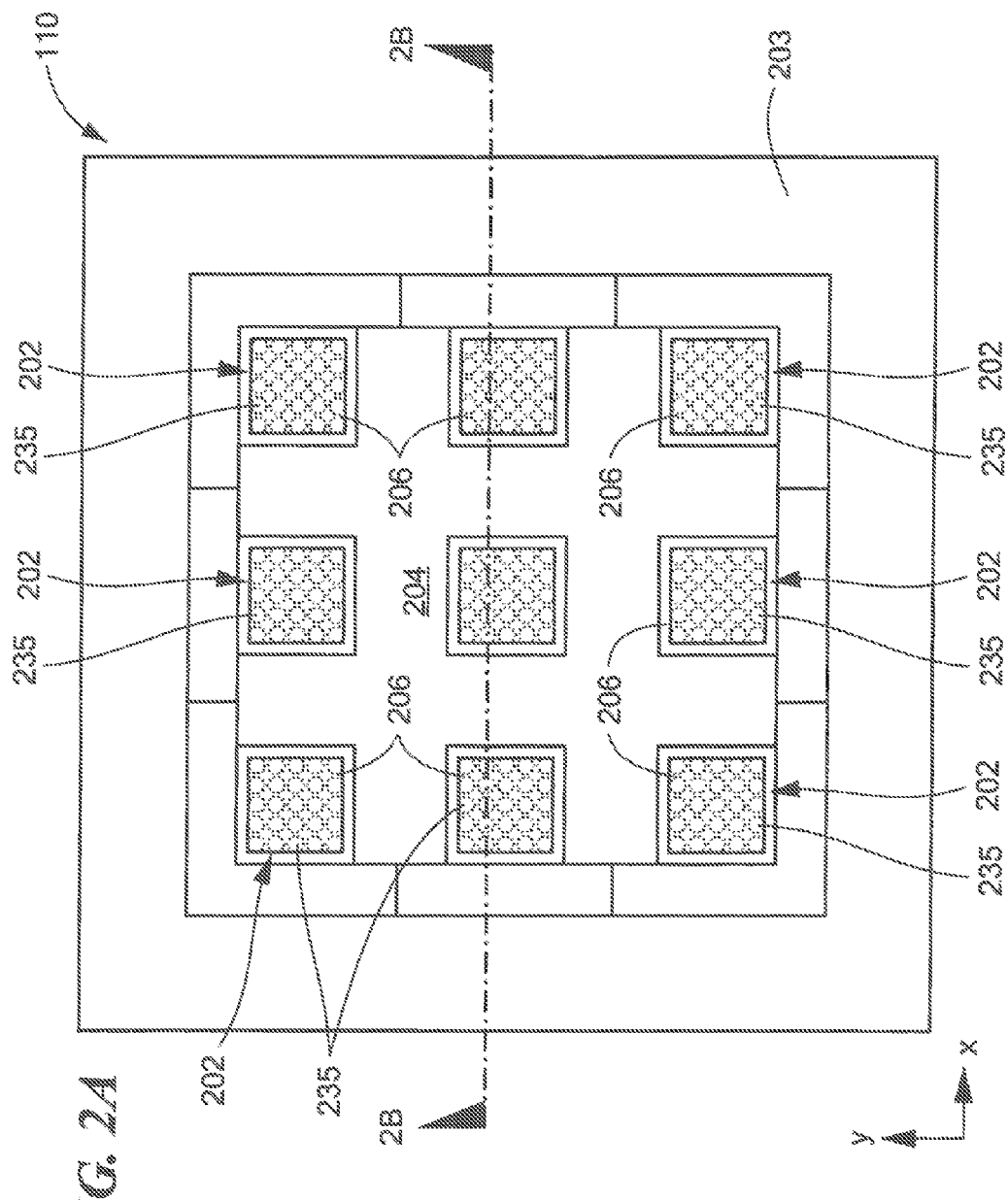

PHOTO-DETECTOR HAVING PLASMONIC RESONANCE AND PHOTON CRYSTAL THERMAL NOISE SUPPRESSION

TECHNICAL FIELD

This disclosure relates generally to photo-detectors and more particularly to radiation detectors having thermal noise suppression.

BACKGROUND

As is known in the art, infrared photon detectors (also referred to as a photo-detector) based on narrow bandgap semiconductors are susceptible to performance degradation due to noise thermally generated by charge carriers masking signal carriers generated by incident photon radiation. This noise is typically characterized by high dark current densities in photovoltaic and photoconductive infrared detectors and can lead to decreased sensitivity of the device. To mitigate thermal noise effects, photo-detectors are typically cooled to cryogenic temperatures using large and expensive systems. Such cooling systems limit the ability of the detector package to meet size, weight, power, and cost constraints of certain applications.

The relationship between detector volume and dark current density is well known and device designs and material parameters that determine detector volume are traditionally optimized to achieve desired performance requirements. More particularly, infrared photo-detectors based on narrow bandgap semiconductors are susceptible to thermally generated noise, resulting in signal-to-noise ratio reduction. Reducing photo-detector volume results in lower dark current density (thermal noise) in narrow bandgap semiconductors due to fewer available charge carriers. However, reducing the photo-detector volume also results in low photon absorption due to reduction in absorptive material.

Device architectures designed to reduce material volume for thermal noise reduction use classical designs and techniques such as non-equilibrium detector architectures for alloys, superlattice and barrier structures, and absorber layer thinning. However, these architectures used singularly compromise photon absorption due to the reduction in detector material.

SUMMARY

In accordance with the present disclosure, a photo-detector is provided, comprising a photonic crystal structure and a plasmonic resonance structure.

In one embodiment, the photonic crystal structure absorbs photons passing perpendicular to a surface of the photo-detector and the plasmonic resonance structure absorbs photons passing along the surface of the photo-detector.

In one embodiment, a photo-detector comprises a photonic crystal structure comprising first and second dielectric regions disposed in a periodic structure projecting into an interior of the photo-detector from a surface of the photo-detector, where the first and second regions have different dielectric constants, and a plasmonic resonance structure disposed along the surface of the photo-detector.

The disclosed photo-detector provides photon absorption enhancement in a three-dimensionally, volume-reduced semiconductor based photo-detector. More particularly, the photo-detector provides photon absorption with a plasmonic resonance structure for photon absorption along a surface of the photo-detector (i.e., the x-y plane) reducing the volume in the z-plane, and a photonic crystal structure for photon collection in a direction perpendicular to the surface of the photo-detector (i.e., along a vertical or z-axis) reducing the volume in the x- and y-plane. Thus, the volume-reduced, semiconductor-based photo-detector provides photon absorption enhancement using multiple embedded plasmonic resonance and photonic crystal structures. Therefore, the resulting total dark current reduction factor, $F_{TOTAL}$, of the detector is the product of the dark current reduction factor $F_{PRS}$ of the plasmonic resonance structure (PRS) and dark current reduction factor $F_{PCS}$ of the photonic crystal structure (PCS). Thus, if the $F_{PRS}$ is 5 and the $F_{PCS}$ is 50, $F_{TOTAL}$ is 250 because the volume reduction associated with PRS and PCS structures reduce dark current independently of one another. Further, the detector achieves 3-D (x-, y-, z-) volume, and hence, dark current reduction compared to only the 1- or 2-D detector volume reduction obtained with the singular use of a photonic crystal structure (PCS) or plasmonic resonance structure (PRS), respectively.

The use of embedded plasmonic resonance and photonic crystal structures facilitates significant material removal, resulting in a three-dimensional volume reduction of the semiconductor in the x-, y-, and z-directions without compromising photon absorption. That is, the disclosed detector achieves reduced dark current density for improved performance at a given operating temperature or higher temperature operation in a narrow bandgap semiconductor based photo-detector.

More particularly, the disclosed photo-detector utilizes a plasmonic resonator structure in conjunction with a photon collection structure, wherein both structures are embedded in the semiconductor material for three-dimensional (x-y-z) volume reduction. The semiconductor photo-detector may be photovoltaic or photoconductive in nature with sequential layers grown on an infrared transparent substrate such that charge carriers generated by the absorption of incident light propagate through the material to the contacts or conductive layers which feed out to circuitry. The photo-detector disclosed includes a plasmonic resonator which may be embodied as an ordered grid, grating, or series of corrugations composed of a highly conductive material embedded on the top or front side (epitaxial-side) of the photo-detector but can also be applied to the back or rear side (substrate-side) of the photo-detector. The structure is in contact with a wide bandgap semiconductor layer with a high refractive index which is in contact with another semiconductor region of a narrow bandgap tuned for the incident infrared photon wavelength of interest. The highly conductive layer serves not only as a resonator, but also as a contact layer. Incident photons propagating through the material from the substrate side interact with the plasmons existing at the interface of the corrugated, highly conductive layer and the wide bandgap, high refractive index material. Photons couple to the plasmons, resulting in an electric field resonance occurring laterally along the length of the device (x- and y-directions) as opposed to vertically (z-direction). The benefit of the lateral field propagation arises from the elimination of vertical material thickness for photon absorption. In conjunction, the disclosure utilizes a photonic crystal configuration as a photon collection structure. The detector is modified such that material is removed from its layers, resulting in an ordered pattern embodied as a multiple pillar configuration or a planar structure with multiple vertical cavities. The manipulation of electromagnetic waves propagating through said ordered material results in the absorption enhancement of incident photons. In this manner, the detector volume is further reduced in x- and y-directions because of the additional absorption along the z-axis. In total, the detector volume is reduced in three-dimensions in conjunction with photon absorption enhancements added through the described modifications. Furthermore, due to the z-direction volume reduction, pillar structures of the photonic crystal are limited to low aspect ratios. From the standpoint of implementation this attribute is highly beneficial for 1) achieving fine featured corrugations to each photonic crystal element to optimize performance, and 2) ease of achieving low aspect ratio structures using conventional semiconductor fabrication processes.

Thus, the disclosed photo-detector provides: a) Three-dimensional material volume reduction through the innovative use of plasmonic resonance and photon trapping structure, compared with only one- or only two-dimensional reduction proposed in prior art, b) Enhancement of individual photon trapping structure in conjunction with plasmonic resonance structure, c) Ease of implementation and optimization of embedded photon enhancement structure due to low aspect ratio made possible by plasmonic resonance structure.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 2A is a plan view of an exemplary one of the photo-detectors used in the array of FIG. 1, prior to fabricating of an electrical contact for the photo-detector detectors in accordance with the disclosure;

Like reference symbols in the various drawings indicate like elements.

DETAILED DESCRIPTION

Figure 1:
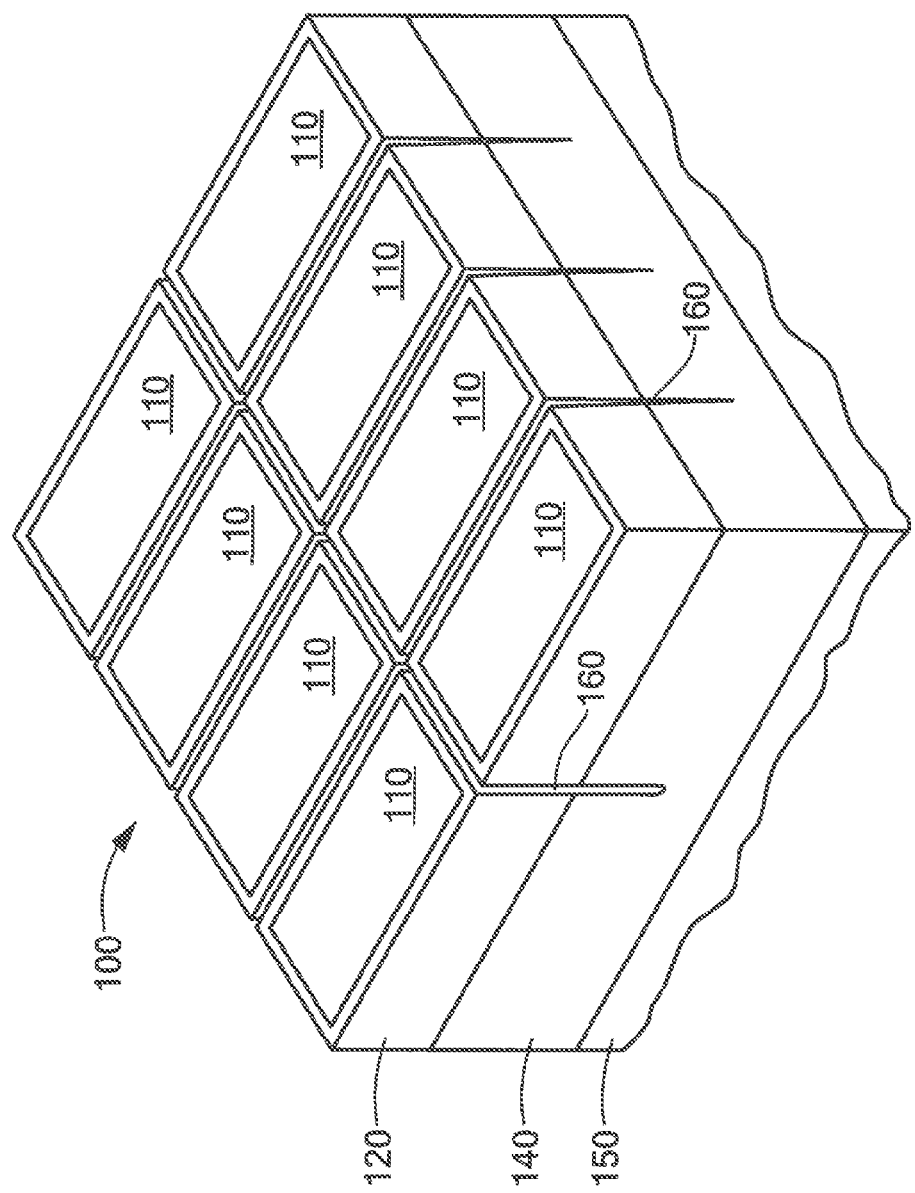
FIG. 1 is a diagrammatical sketch of a portion of an array of photo-detectors in accordance with the disclosure.

Referring now to FIG. 1, a portion of a focal plane array (FPA) 100 of infrared photo-detectors 110 is shown. In the illustrated example, the FPA 100 includes a two-dimensional array of eight, here, for example, mesa-shaped, photo-detectors or unit cells 110 formed on a common substrate, 150; however, those skilled in the art will appreciate, given the benefit of this disclosure, that the FPA may include any number of detectors arranged in one, two or three dimensions. Additionally, each infrared photo-detector 110 may have any shape and dimension suitable for radiation detection. The infrared detectors 110 may be at least partially separated from one another by gaps 160, here air gaps, in which little or no absorption occurs. Each detector 110, here, for example, is a single-waveband (also referred to as single-color) photo-detector 110, according to one embodiment corresponds to a pixel of the FPA 100.

Figure 2B:
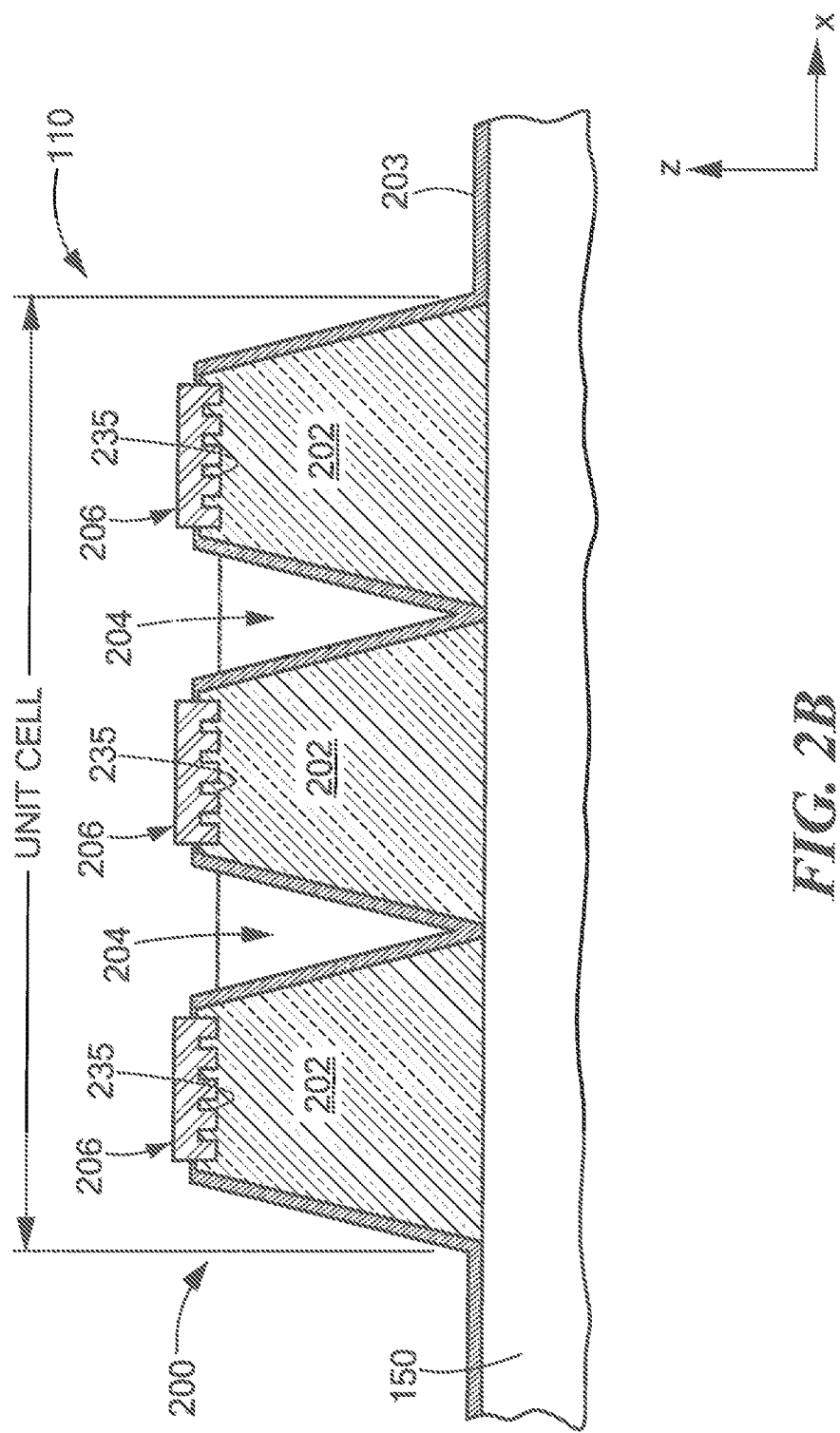
FIG. 2B is a side elevation view of the exemplary one of the photo-detectors used in the array of FIG. 1 taken along line 2B-2B of FIG. 2A detectors in accordance with the disclosure.

An exemplary one of the photo-detectors 110 is shown in FIGS. 2A and 2B. Each one of the photo-detectors 110 includes: a photonic crystal structure 200 (FIG. 2B) comprising first and second dielectric regions 202, 204, respectively, disposed in a periodic structure projecting into an interior of the photo-detector 110, the first and second regions 202, 204 having different dielectric constants. Here, the first dielectric regions 202 are pillar-like structures 202 described in more detail in FIG. 3, and the second dielectric regions are the air-filled regions 204 disposed between the pillar-like structures 202. It is noted that air filled regions 204, are disposed in rows and columns in the x-y plane and extending vertically along the z-axis between the pillar-like structures 202. As noted above, the pillar-like structures 202 and the air-filled regions 204 are arranged with proper spacing to provide the photonic crystal structure 200 for absorbing photons passing vertically into the photo-detectors 110 and each one of the pillar-like structures 202 has on a top surface thereof, a plasmonic resonance structure 206 for absorbing photons along the top surface of each one of the pillar-like structures or elements 202. The periodicity of the pillar-like structures 202 providing the photonic crystal structure 200 is around half the wavelength of the photons that are to be absorbed. It should be understood that the second regions 204 instead of being air-filled regions may be filled with a solid dielectric material having a dielectric constant different from the dielectric constant of regions 202.

Figure 3:
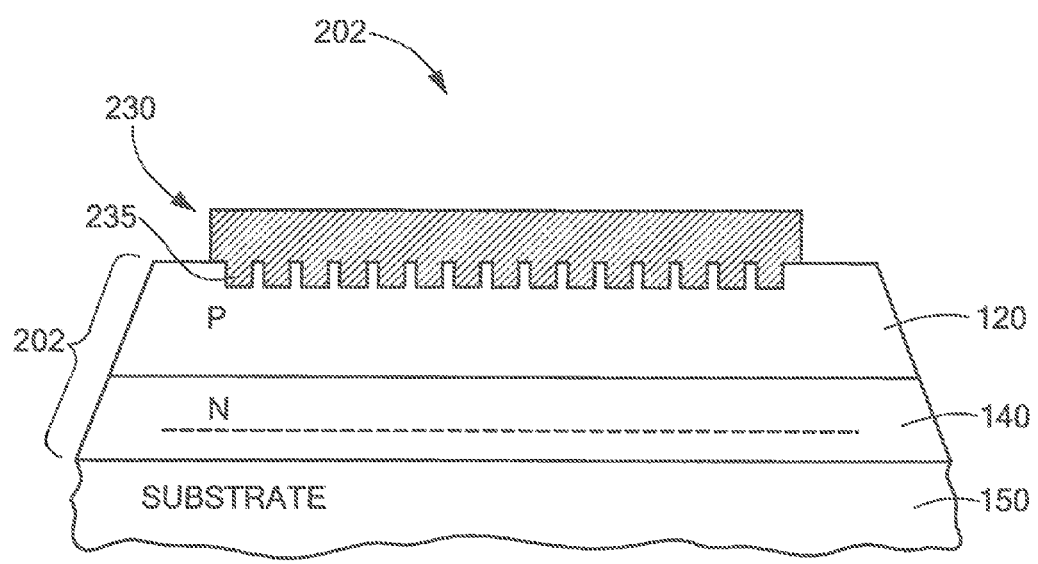
FIG. 3 is a cross sectional view of a portion of an exemplary one of the photo-detectors used in the array at one stage in the fabrication thereof, such stage showing the photo-detector subsequent to forming a plasmonic resonance structure for the photo-detector and prior to forming a photonic crystal structure for the photo-detector.

Referring to FIG. 3, the substrate 150 may be a wafer comprising silicon (Si), germanium (Ge), cadmium telluride (CdTe), cadmium zinc telluride (CdZnTe), gallium arsenide (GaAs), and/or any other suitable substrate material or combination of substrate materials upon which semiconductor layers 120, and/or 140 (FIG. 1) may be formed and which are transparent to the radiation being detected by the photo-detectors. The semiconductor layer(s) 120 and/or 140 may be formed using any suitable semiconductor process, including epitaxy, for example, such as molecular beam epitaxy, metalorganic vapor phase epitaxy or liquid phase epitaxy. At least one of the semiconductor layers 120 and/or 140 may include a material having energy bandgaps responsive to radiation in a spectral region (or waveband) of interest (referred to as an absorber layer). Some examples of materials include, but are not limited to, Silicon, GaAs, InGaAs, HgCdTe, lead chalcogenides, and super lattices. According to one embodiment, one or more of the detectors 110 are configured to leverage surface plasmon resonance to thin at least one of the semiconductor layers acting as the absorber for at least one waveband of the detector.

A plasmonic resonance structure 230 is also formed across the array 100, reference being made to U.S. Patent Application Publication No. 2013/0228887, entitled "PHOTODETECTOR WITH SURFACE PLASMON RESONANCE", inventors Justin Gordon Adams Wehner, et al., published Sep. 5, 2013, filed Sep. 12, 2012 and assigned to the same assignee as the present patent application. After forming the plasmonic resonance structure 230 across the array 100, the array is processed using conventional photo-lithographic-etching to form the gaps 160 (FIG. 1) between the individual photo-detectors 110, an exemplary one thereof being shown in FIG. 3.

Thus, here each one of the photo-detectors 110, and as will be described, will have both a photonic crystal structure, to be described in addition to the plasmonic resonance structure 230. More particularly, each one of the pillar-like structures 202, includes a semiconductor photon absorber layer 140 (FIG. 3), which may be formed on a substrate 150 using any suitable semiconductor manufacturing process, as discussed above, and has an energy bandgap responsive to radiation in a spectral region of interest. A semiconductor collector layer 120 (FIG. 3) is coupled to the absorber layer 140 and has formed in the upper surface thereof the plasmonic resonance structure 230. In the illustrated example, the absorber layer 140 is an n-type layer and the collector layer 120 is a p-type layer, thereby creating a p-n junction. However, it is to be appreciated that the electrical conductivity type of the layers 140, 120 may be reversed in other examples. In addition, as discussed further below, the device may be formed with an nBn-type configuration, rather than a p-n (or n-p) junction. An nBn configuration, not shown, is a multi-layer barrier type device where n indicates the layer doping type and B indicates a doped or undoped wide band gap layer. The device may alternatively be formed with a pBp configuration, namely, a barrier type device where p indicates the layer doping type and B indicates a doped or undoped wide band gap layer or alternatively of any combination of carrier types and barrier known in the art. Next, the plurality of pillar-like structures 202 are formed in each one of the photo-detectors 110, now having the plasmonic resonance structure 230 on the top surface thereof, using conventional photo-lithographic-etching techniques to provide the photo-detectors described above in connection with FIGS. 2A and 2B. Thus, as noted above, each one of the photo-detectors 110 has the plurality of pillar-like structures 202 formed to provide the photonic crystal structure 200. Thus, each pillar-like structure in each one of the detectors 110 includes a semiconductor photon absorber layer 140, which may be formed on a substrate 150 using any suitable semiconductor manufacturing process, as discussed above, and has an energy bandgap responsive to radiation in a spectral region of interest. A semiconductor collector layer 120 (FIG. 32) is coupled to the absorber layer 140.

The plasmonic resonance structure 230 is formed as a metal layer. The plasmonic resonator structure 230 operates by resonating incident flux, causing a field to be built up in the absorptive region (absorber layer 140). The interaction between electromagnetic (EM) waves and surface charges (metal) increases momentum of the surface plasmon polariton (SPP), deviating from momentum of incident light through air. When the momentum of incident light and surface plasmon matches, resonance will occur. The momentum of incident light can be increased by matching periodic grating to x-y surface plasmon.

More particularly, generated carriers are separated and collected in the absorptive layer 140 in accordance with normal operation of a photovoltaic device. In the illustrated example, the plasmonic resonator 230 is formed with a metal grating structure that includes, in this example, circular protrusions or ridges 235 (FIGS. 3 and 2A and 2B) that are periodically spaced along the top photo-detector 110. The dimensions of the ridges 235 and period of the grating may be tailored to focus plasma waves into the absorber layer 140, and to achieve a desired wavelength selectivity or polarization selectivity, as discussed further below.

In one embodiment, the resonance of the plasmonic resonator 230 allows the absorber layer 140 to be sufficiently thinned such that it may be fully depleted or close to fully depleted at standard operating voltages. Depletion of the absorber layer 140 means that limiting mechanisms at high temperatures, such as Auger recombination, are suppressed. Furthermore, as discussed above, volume reduction also reduces the sensitivity of the device to thermal noise, and reduces "dark current." Dark current is the constant response exhibited by a receptor of radiation during periods when it is not actively being exposed to light. In particular, in the context of a photo-detector or photovoltaic device, dark current refers to the relatively small electric current that flows through the photosensitive device when no photons are entering the device.

According to one embodiment, one or more of the detectors 110 are configured to leverage surface plasmon resonance to thin at least one of the semiconductor layers acting as the absorber for at least one waveband of the detector.

As noted above, the plasmonic resonator 230 operates by resonating incident flux, causing a field to be built up in the absorptive region (absorber layer 140) of the pillar-like structure 202. Generated carriers are separated in the absorptive region and collected in accord with normal operation of a photovoltaic device. In the illustrated example, as noted above, the plasmonic resonator 230 is formed with a grating structure that includes protrusions or ridges 235 that are periodically spaced along the surface of the a pillar-like structures 202 (i.e., in the x-y plane). The dimensions of the ridges 235 and period of the grating may be tailored to focus plasmonic oscillations into the absorber layer 140, and to achieve a desired wavelength selectivity or polarization selectivity, as discussed further below. In addition, the design of the plasmonic resonator may be varied on a per pixel basis, to provide individualized spectral and/or polarization responses for the pixels of a detector array. Responsive to incident radiation in the z-direction (generally normal to the surface of the detector a pillar-like structure 202), the plasmonic resonator 206 causes a resonance in the x-y plane, thereby allowing a very thin absorber layer 140 to collect substantially all photons and maintain a high quantum efficiency. As a result, volume reduction (thinning) of the absorber layer 140 may not hinder optical performance of the detector 110, thereby improving signal to noise.

As discussed above, the detector 100 illustrated in FIG. 2 may be a single-color (or single-waveband) device. There are several single-color implementations that may leverage surface plasmon resonance for various different sensing applications. For example, the detector 110 of FIGS. 2A and 2B may provide a narrow-band sensor that may be used for resonant detection. The dimensions of the resonator are typically determined by the operating wavelength, material properties, and desired response/sensitivity, as described in the above referenced U.S. Patent Application Publication No. 2013/0228887. It should be understood that the detectors may be arranged in an array of photo-detectors 100 with different ones of the detectors in the array being responsive to different frequencies and/or polarizations such as in a dual or multi-waveband detector array and be applied selectively to a single band, or to multiple bands.

In addition, the design of the plasmonic resonator structure 230 may be varied on a per pillar-like structure 202 basis, to provide individualized spectral and/or polarization responses for the pillar-like structure 202 of a detector 110. Responsive to incident radiation along the z-axis (generally normal to the surface of the a pillar-like structure 202, the plasmonic resonator 230 causes a resonance in the x-y plane, thereby allowing a very thin absorber layer 140 to collect substantially all photons and maintain a high quantum efficiency. As a result, volume reduction (thinning) of the absorber layer 140 may not hinder optical performance of the detector 110, thereby improving signal to noise.

As described above, the plurality of pillar-like structures 202 are configured and positioned, with respect to each other, to provide the photonic crystal structure 200 for collecting photons passing perpendicular to the top surface of the photo-detector 110. The photonic crystal comprises periodic dielectric structures that affect EM propagation. Patterns can be defects, holes, or, as described above, pillars. Regular repeating regions of high dielectric constant (the column 202)-low dielectric constant (the air filled regions 204) provide the periodic dielectric function. Pattern spacing affects scattering of certain wavelength bands, limits EM propagation (scattering of wavelengths result in coherent canceling, photonic bandgap). EM plane waves with wavenumber $k=\pi/a$ result in E-field peaks in high and low dielectric materials. Optical absorption is uncompromised by reduction of material volume (x-, y-dimension optical area) due to concentration of fields in photo-detector. EM coupling is achieved by adjusting the periodicity of the elements 202, 204 as well as the contrast between the high-low dielectric constants (air/other material vs. semiconductor). Reduction of volume in z-direction by including the plasmonic resonator allows lower aspect ratio for ease of fabrication resonator structure on each pillar. The plasmonic resonance structure is, as noted above, created as conductive material (metal) grid on the top of each column-like structure 202. The sides of columns 202 may be passivated with a dielectric layer 203 to provide the desired high-low dielectric constant contrast.

It is noted that the plasmonic resonance structure 230 and the photonic crystal photon resonant structure 200 are designed so both resonators work together to obtain the synergistic effect of absorbing, within each one of the photo-detector cells 110, photons in the x-y plane and along the z-axis, that is, in three dimensions. This is done by tuning the following design parameters:

Plasmonic resonance structure 230 parameters:
(a) metal teeth (corrugation posts/pillar) width (diameter), height, pitch, fill factor (where fill factor, FF, is the percentage of width for a given pitch); e.g. FF=width_teeth/pitch, pitch=width+spacing; the periodic spacing establishes resonance of photons of a particular wavelength;
(b) thickness of metal sheet on top of the teeth;
(c) dielectric constant (should be high) of material immediately adjacent to the resonator (this material will be sandwiched by the corrugation and the detector absorber);
(d) thickness of photo-detector 110 material immediately adjacent to the resonator 230

Photonic crystal structure 200:
(a) photonic crystal structures 200 are made of the photo-detectors 110 layers and the high dielectric material (mentioned above);
(b) ratio of pillar-like structure 202 to air-filled regions 204 width/diameter (this would be the top measurement of the 'mini-mesas' in a single unit cell 110), height, pitch, fill factor, again periodic spacing will help with scattering of photons of particular wavelength between the trapping structures.

It should also be noted that these design parameters could change on a pixel by pixel basis to enable each pixel to be sensitive to a different wavelength, polarization, or other property of the incident light. This tuning could be confined to blocks of super-pixels, or continuously vary across the whole array.

Figure 4:
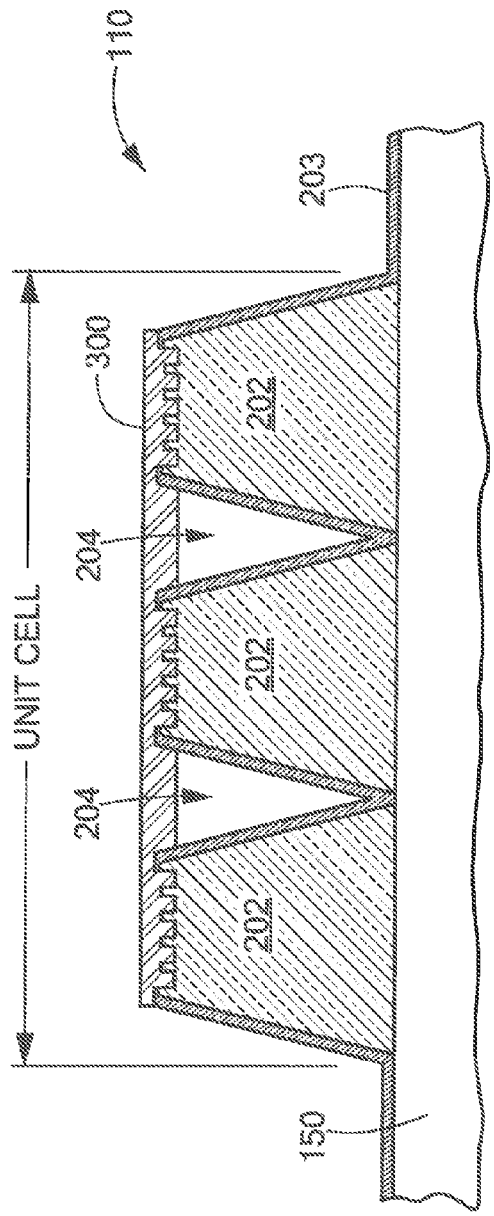
FIG. 4 is a side elevation view of an exemplary one of the photo-detectors used in the array of FIG. 1 after fabricating of the electrical contact for the photo-detector.

Referring now to FIG. 4 an electrically conductive member 300 is formed in ohmic contact across the tops of the pillar-like structures 202 for each one of the mesa-like photo-detectors 110, as shown. The electrically conductive member 300 provides an electrical contact for the photo-detector cell. The conductive member 300 may be fabricated any one of several ways. For example, if air-filled regions 204 are desired, the air-filled regions 204 may be initially filled with a sacrificial material, such as a soluble photoresist material, then the now planar surface is processed using conventional photolithographic-etching techniques to form the patterned electrically conductive member 300. After forming the electrically conductive member 300, the sacrificial material is washed away. On the other hand, if regions 204 are to be filled with a solid dielectric material, it would remain after forming the electrically conductive member 300. Member 300 is illustrated with corrugations only in the absorbing region, though one skilled in the art will appreciate that the corrugations may continue into the dielectric region as needed or desired.

Figure 5:
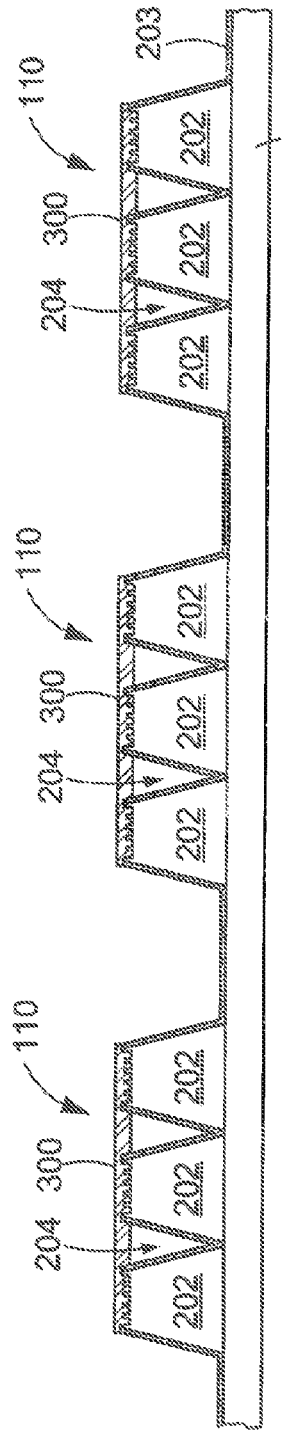
FIG. 5 is a side elevation view of an array of the photo-detectors of FIG. 4.
Figure 5A:
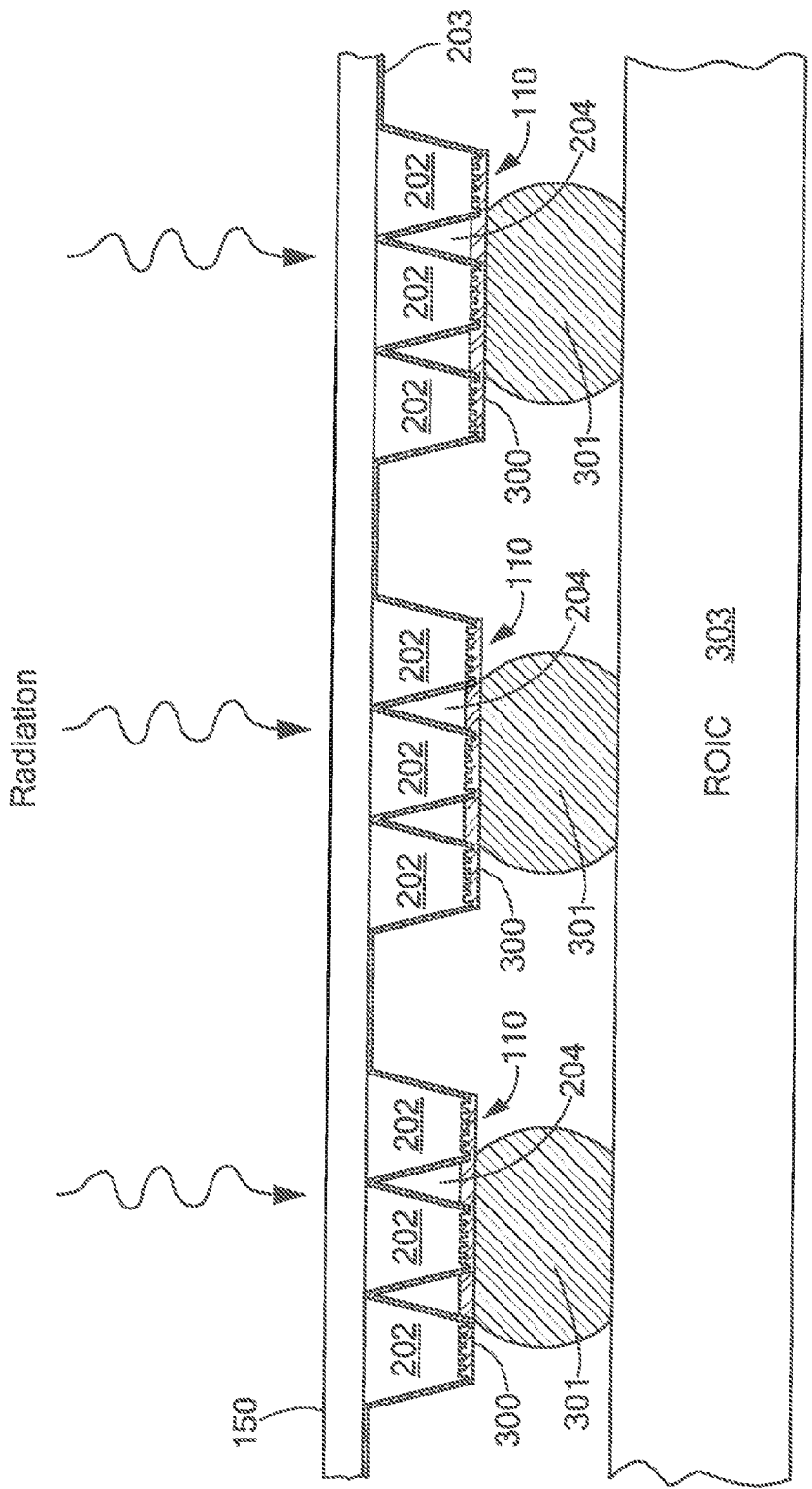
FIG. 5A is a side elevation view of the array of photo-detectors of FIG. 5 mounted to a Read-Out Integrated Circuit (ROIC)
Figure 6A:
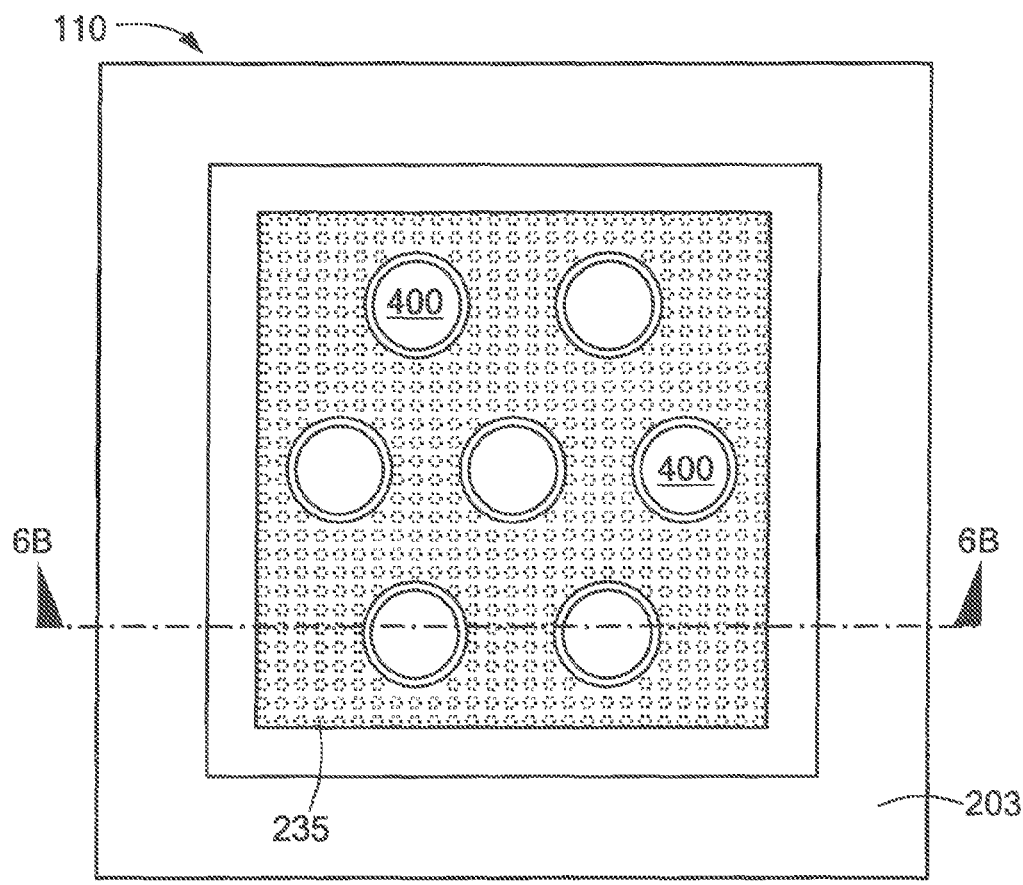
FIG. 6A is a plan view of an exemplary one of the photo-detectors used in the array of FIG. 1, prior to fabricating an electrical contact for the photo-detector according to an alternative embodiment of the disclosure.
Figure 6B:
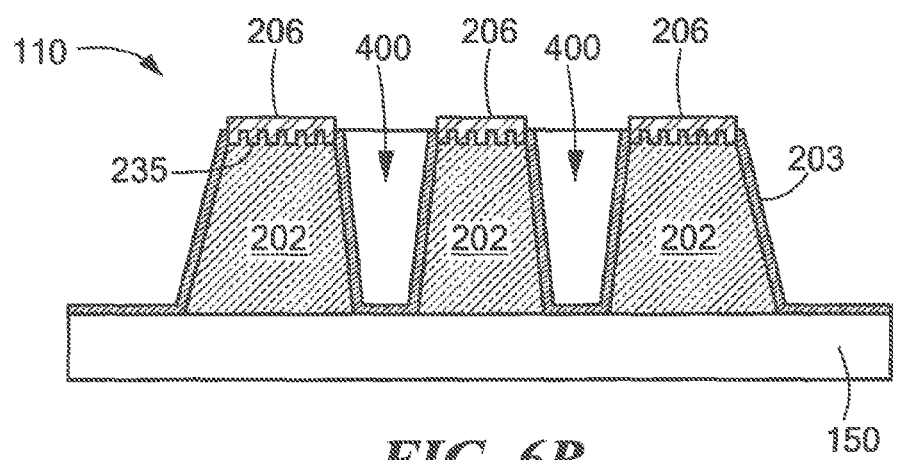
FIG. 6B is a side elevation view of the exemplary one of the photo-detectors used in the array of FIG. 1 taken along line 6B-6B of FIG. 6A detectors in accordance with the disclosure.
Figure 7A:
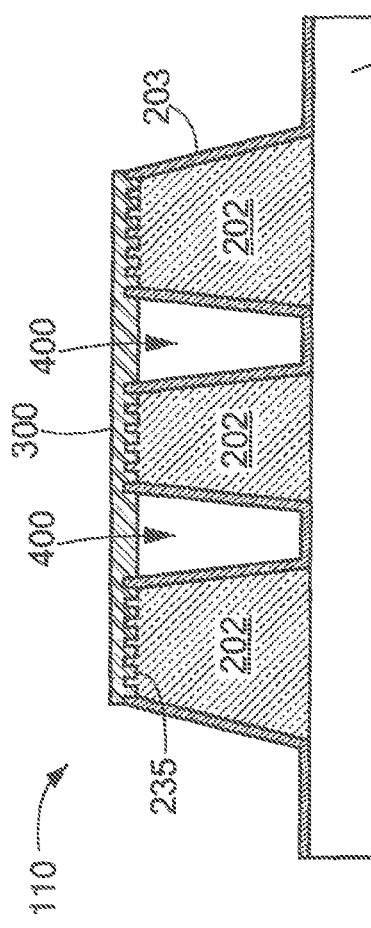
FIG. 7A is a side elevation view of the an exemplary one of the photo-detectors used in the array of FIG. 1 after fabricating the electrical contact for the photo-detector.
Figure 7B:
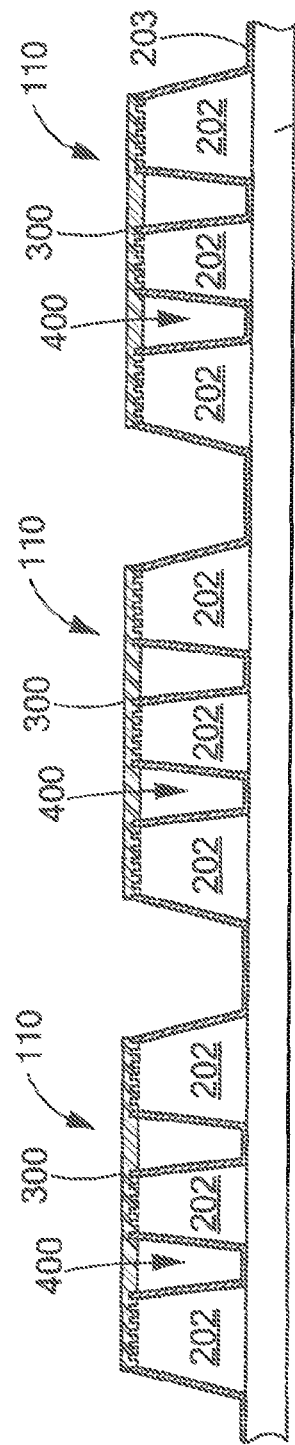
FIG. 7B is a side elevation view of an array of the photo-detectors of FIG. 7A.

Referring to FIG. 5, an array of the photo-detectors 110 is shown; each one of the photo-detectors 110 having both the plasmonic resonance structure 230 and the photonic crystal structure 200. FIG. 5A is a side elevation view of the array of photo-detectors of FIG. 5 mounted to an Read-Out Integrated Circuit (ROIC) 33 using electrical contacts 301.

A number of embodiments of the disclosure have been described. Nevertheless, it will be understood that various modifications may be made without departing from the spirit and scope of the disclosure. For example, the highly conductive corrugated material constituting the plasmonic resonator may extend over the spacing between the photonic-crystal structures. Still further, while the photonic crystal structure 200 has been described as first and second dielectric regions 202, 204 being column-like structures 202 with air-of solid dielectric regions 204, disposed in a periodic structure, the photonic crystal structure 200 may be formed by forming holes 400 as shown in FIGS. 6A, 6B, 7A and 7B vertically into the surface of the photo-detector 110 with the holes providing the above-mentioned second regions and the remaining portions providing the above-mentioned first regions. It should also be noted that the holes may be filled with a solid material as described above to regions 204. Further, it should be noted that the plasmonic resonator may be formed before the formation of the photonic crystal, as described above, or it may be formed subsequent to the formation of the photonic crystal. Accordingly, other embodiments are within the scope of the following claims.

What is claimed is:

1. A photo-detector, comprising:
a photonic crystal structure comprising a plurality of pillar-like first dielectric regions and a plurality of second dielectric regions, each one of the second dielectric regions being disposed between a pair of the pillar-like first dielectric regions, the pillar-like first plurality of dielectric regions having a different dielectric constant than the plurality of second dielectric regions;
a plurality of plasmonic resonance structures, each one of the plurality of plasmonic resonance structures having a surface, such surface having a protrusion projecting outwardly from the surface, such protrusion projecting into a top surface of a corresponding one of the plurality of pillar-like first dielectric regions.

2. The photo-detector recited in claim 1 wherein the plurality of spaced pillar-like structures are spaced in accordance with a predetermined wavelength of photons to be absorbed by the photonic crystal structure.

3. The photo-detector recited in claim 2 wherein each one of the plurality of the plasmonic resonance structures comprises a metal grating structure having a plurality of spaced ridges.

4. A photo-detector, comprising:
a photonic crystal structure comprising a plurality of pillar-like first dielectric structures, each one of the plurality of pillar-like first dielectric structures having a top surface and sidewalls, and a plurality of second dielectric regions, each one of the second dielectric regions being disposed between a pair of the pillar-like first dielectric structures, the pillar-like first plurality of dielectric structures having a different dielectric constant than the plurality of second dielectric regions;
a plurality of plasmonic resonance structures, each one of the plurality of plasmonic resonance structures being disposed on a corresponding one of the plurality of pillar-like first dielectric structures, each one of the plurality of plasmonic resonance structures having a plasmonic resonance structure surface facing the top surface of the corresponding one of the plurality of pillar-like first dielectric structures, the plasmonic resonance structure surface of each one of the plurality of plasmonic resonance structures having a protrusion spaced from the sidewalls of the corresponding one of the plurality of pillar-like first dielectric structures and projecting outwardly from the plasmonic resonance structure surface, such protrusion projecting into the top surface of the corresponding one of the plurality of pillar-like first dielectric regions.

* * * * *